US011281576B2

(12) United States Patent
Vielcanet et al.

(10) Patent No.: US 11,281,576 B2
(45) Date of Patent: Mar. 22, 2022

(54) MEMORY DEVICE

(71) Applicant: Melexis Technologies NV, Tessenderlo (BE)

(72) Inventors: Nicolas Vielcanet, Paris la Defense (FR); Philippe Laugier, Paris la Defense (FR); Thomas Freitag, Erfurt (DE); Benoit Heroux, Cormeilles (FR)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 190 days.

(21) Appl. No.: 16/878,962

(22) Filed: May 20, 2020

(65) Prior Publication Data

US 2020/0394132 A1    Dec. 17, 2020

(30) Foreign Application Priority Data

Jun. 13, 2019 (EP) .................................. 19179971

(51) Int. Cl.
| | | |
|---|---|---|
| *G06F 12/14* | (2006.01) | |
| *G06F 12/02* | (2006.01) | |
| *G06F 9/30* | (2018.01) | |
| *G06F 9/48* | (2006.01) | |
| *G06F 11/07* | (2006.01) | |
| *G06F 11/32* | (2006.01) | |

(52) U.S. Cl.
CPC ...... *G06F 12/0246* (2013.01); *G06F 9/30189* (2013.01); *G06F 9/4812* (2013.01); *G06F 11/0772* (2013.01); *G06F 11/327* (2013.01); *G06F 12/1466* (2013.01)

(58) Field of Classification Search
None
See application file for complete search history.

(56) References Cited

U.S. PATENT DOCUMENTS

| | | | |
|---|---|---|---|
| 5,892,711 A | 4/1999 | Park | |
| 6,031,757 A | 2/2000 | Chuang et al. | |
| 6,731,536 B1 | 5/2004 | McClain et al. | |
| 9,996,711 B2* | 6/2018 | Krithivas | G06F 21/44 |
| 10,754,962 B2* | 8/2020 | Gandhi | H04W 12/068 |
| 2010/0031349 A1* | 2/2010 | Bingham | G06F 21/31 |
| | | | 726/20 |
| 2010/0088527 A1* | 4/2010 | Johnson | A63F 13/98 |
| | | | 713/193 |
| 2011/0067460 A1* | 3/2011 | Niwa | G06F 21/79 |
| | | | 70/58 |
| 2012/0084573 A1 | 4/2012 | Rudelic et al. | |

FOREIGN PATENT DOCUMENTS

WO      2005031754 A1    4/2005

OTHER PUBLICATIONS

European Search Report in Corresponding EP application No. 19179971.7 dated Nov. 20, 2019.

* cited by examiner

*Primary Examiner* — Michael Sun
(74) *Attorney, Agent, or Firm* — Workman Nydegger

(57) ABSTRACT

A memory device includes a non-volatile memory block, a protection unit arranged for connecting to a communication bus, and a sequencer arranged to receive commands from the protection unit. A logic circuit is arranged to output an enabling signal, and includes first and second logic subcircuits, and a combiner logic circuit.

15 Claims, 4 Drawing Sheets

MEMORY DEVICE

FIELD OF THE INVENTION

The present invention is generally related to the field of memory devices used in integrated circuits.

BACKGROUND OF THE INVENTION

Contrary to, for example, latches, FlipFlops or Random Access Memories (RAMs), non-volatile memories keep their memory content also when the power supply is switched off. Therefore, it must be ensured that any access to this memory do not destroy or harm the data content, as the data will also be present after e.g. a Power On Reset, thus a supply removal of the integrated circuit.

A non-volatile memory (NVM) may contain several types of data. Flash memory is e.g. used for storing a program or instructions to be executed by e.g. a state machine or a Central Processing Unit (CPU), whereas calibration value data or application data for instance is located in an EEPROM (Electrically Erasable Programmable Read Only Memory) or a NVRAM (Non Volatile Random Access Memory).

Different from a program or instruction memory (e.g. Flash memory), which is usually only written once or very few times, a data memory (e.g. EEPROM) might be written much more often. Data to be stored may change and the memory must be updated with the changing data.

An unexpected erase or program operation in a NVM might corrupt the memory content and lead to chip malfunction. If a program memory (e.g. Flash memory) is corrupted, the program will behave differently, so that the chip functionality is no longer ascertained. If a data memory (e.g. EEPROM) is corrupted, incorrect calibration values can lead to e.g. a sensor failure. In certain architectures also calibration data for e.g. the hardware of a program memory (e.g. charge pump voltage configuration values or read out threshold values) might be located in the data memory. In such configurations, a corrupted calibration data content in the data memory (e.g. EEPROM) leads to a malfunction of the program memory (e.g. Flash memory).

The protection of non-volatile memory against an unwanted write or erase access has been addressed numerous times in the past and several types of solutions have been developed. However, with the advent of the ISO26262 standard and its requirements, functional safety related elements need to be additionally considered, thus there is a need for improvement.

Application WO2005/031754 A1 discloses a non-volatile semiconductor memory device including a memory cell array constituted by a plurality of memory blocks, an interface, a write circuit and a read circuit. A protect flag is written in the memory block. The readout protect flag can be output to an external device through the interface. When a write command is input from the interface, the write circuit executes the write command, when the protect flag in the selected memory block has a first value and does not execute the write command, when the protect flag has a second value. The protect flag only carries a single value and is part of the memory device itself. This means that if the memory is faulty so that the flag carries a wrong value, a write access is possible.

US2012/084573 discloses a method comprising: receiving a write command by a main memory, accessible to the processor, wherein the write command is received by a first memory controller; determining authentication of said write command, wherein the determining is performed by a second controller, disposed within said main memory; and determining, whether to modify contents of main memory, at least partly based on said determined authentication of said write command. A cryptographic key is stored within the memory, which is problematic in case the memory is faulty. Furthermore, the disclosure does not deal with the problem that the comparison result might also not be secure.

Hence, there is a need for a solution to detect unexpected destructive access to a non-volatile memory. If such an event occurs, the access should be discarded, while leaving the NVM content untouched. Moreover, the system must be informed about this incorrect behaviour.

SUMMARY OF THE INVENTION

It is an object of embodiments of the present invention to provide for a memory device adapted for ensuring safe memory access.

The above objective is accomplished by the solution according to the present invention.

In a first aspect the invention relates to a memory device comprising
- a non-volatile memory block to store data to be written, read or erased,
- a protection unit arranged for connecting to a communication bus to detect an unlock, write or erase command and comprising a unit for locking and unlocking said memory block, said unit arranged to receive and process said unlock, write or erase command,
- a sequencer arranged to receive from said protection unit, in accordance with said unlock, write or erase command, an enabling signal to enable access to said memory block, whereby said unit for locking and unlocking comprises, for processing said unlock, write or erase command, a logic circuit arranged to output said enabling signal, said logic circuit comprising
   - a first logic subcircuit arranged for comparing a first part of said command with a first part of a hard coded key, whereby a first subcircuit output signal corresponding to a first active logic signal is output if there is a match between said first part of said command and said first part of said hard coded key
   - a second logic subcircuit arranged for comparing a second part of said command with a second part of said hard coded key, whereby a second subcircuit output signal corresponding to a second active logic signal inverse to said first active logic signal is output if there is a match between said second part of said command and said second part of said hard coded key,
   - whereby one of said first and second logic subcircuit is operable on a logic 1 active signal and the other one is operable on a logic 0 active signal, and a combiner logic circuit arranged for combining said first and said second subcircuit output signal and for outputting said enabling signal corresponding to an active logic signal only if said first and said second subcircuit output signals correspond to said first and second active logic signal, respectively.

The proposed solution indeed allows for an additional check for safe memory access and to detect an unexpected destructive access. The enable signal that is output is only active (e.g. an active logic 1 or logic high level or an active logic 0 or logic low level, depending what has been defined as active logic signal), when the first logic subcircuit outputs a signal corresponding to a first active logic signal and the second logic subcircuit outputs a signal corresponding to a second active logic signal, whereby one subcircuit operates on logic 1 active signals and the other subcircuit on logic 0 active signals.

In an advantageous embodiment the logic circuit is arranged for storing the enable signal as a two-bit information.

In preferred embodiments the sequencer is arranged for setting an operational flag in the non-volatile memory block before actual execution of the write or erase command in the non-volatile memory block can start. The sequencer may be arranged for outputting a signal indicating the execution of the write or erase command has ended.

In embodiments of the invention the memory device further comprises a readout port block arranged to receive, for readout, that signal indicating the execution of the write or erase command has ended.

In embodiments the protection unit is arranged to return to a locked state on receipt of the signal indicating the execution of the write or erase command has ended.

In one embodiment the sequencer is arranged to output the signal indicating the execution of the write or erase command has ended to an interrupt handling device which is external to the memory device.

In a preferred embodiment the mechanism for locking and unlocking can be set in a system mode, in order to allow said write, unlock or erase operation to be performed.

Advantageously, the protection unit comprises storage means for storing said unlock, write and erase commands.

In embodiments of the invention the memory device, more in particular the protection unit, is arranged to return to a locked state if a command following an unlock command is not a write or erase command, or if another memory access is requested, while said write or erase command is being processed.

In one embodiment the memory device comprises a ports bus arranged to receive address information, data information and commands.

In embodiments of the invention the protection unit is arranged for outputting an error message reporting a faulty operation.

In embodiments of the invention the memory device is arranged to receive a lock command to lock the memory block.

In another aspect the invention relates to an integrated circuit comprising a memory device as previously described. In one embodiment the integrated circuit further comprises an interrupt handling device.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
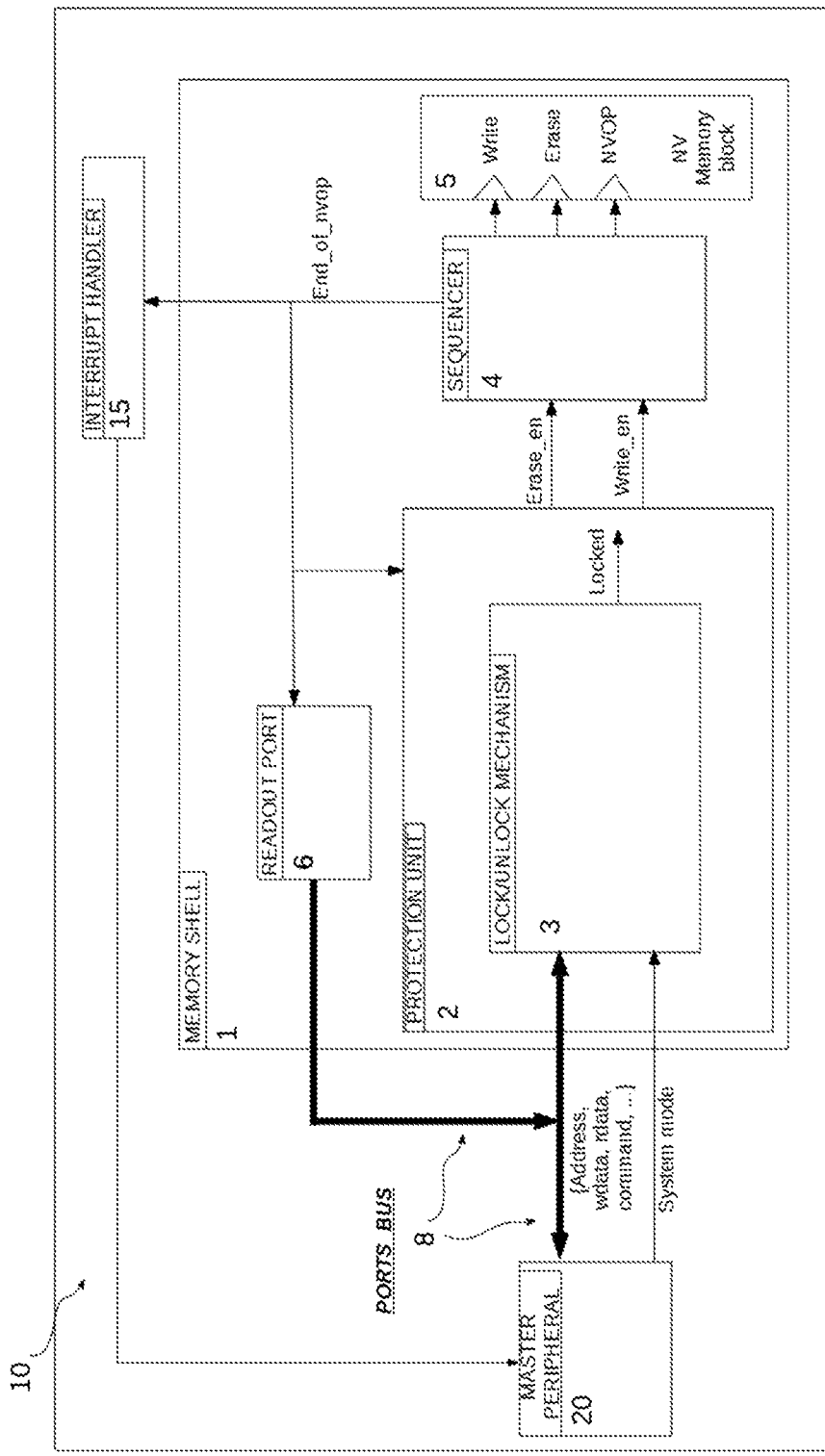
FIG. 1 illustrates a circuit comprising an embodiment of the memory device for safe non-volatile-memory-access according to the invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Non-volatile memories (NVMs) are widely used in integrated circuits to store sensitive data. This disclosure presents a memory device with additional protection against unexpected destructive access.

FIG. 1 illustrates a circuit (10) comprising a master peripheral device (20) connected to an embodiment of the memory device (1) according to the invention. The master peripheral device may be a CPU or a logic state machine or a controller or the like. The memory device (1) is represented in the figure by a block diagram showing its main components. The peripheral device is connected to the memory device, also referred to as memory shell, via a ports bus (8), via which addresses, data and commands can be exchanged between the memory device and the peripheral device. The memory device comprises a non-volatile memory block (5). The memory device converts a ports bus access signal into one or more signals, which drive the Input/Output ports of the memory block (5) according to timing requirements of the memory block.

The ports bus (8) is bidirectional, i.e., addresses/data can be transported from the master peripheral device (20) to the memory device (1) or vice versa. The data can be data to be read or to be written, but data can also be commands as for instance "read", "write", "erase". A read or write command is usually followed by data as e.g. wdata, rdata to be written to or read from a given address. In case of an erase command, there is no data needed, as a given address or address range should be just erased. The ports bus (8) can be a combined address/data bus in some embodiments or a bus with address and data being separated over two buses in other embodiments. In a circuit comprising the memory device according to the invention the ports bus is preferably a Wishbone bus. A Wishbone bus is an open source hardware computer bus intended to let parts of the circuit communicate with each other, so that differing cores can be connected to each other inside the circuit. Such a bus is often divided in several address areas, for instance, one for program memories (e.g. ROM, FLASH), another one for the data memories (e.g. EEPROM, RAM) and an area for ports as in FIG. 1. Ports are typically used to set certain operational modes of given blocks or devices or to read information from these blocks or devices. In FIG. 1 the 'wdata' refers to data to be written to a port/memory block, whereas 'rdata' denotes data sent by a slave to the master peripheral device during e.g. a read access.

In case a Read operation to the memory device is requested by the peripheral device (20), the program or data in the NVM block (5) is not modified. This is in contrast to a Write or Erase operation, which definitely change the stored data. Therefore, in this description only Write and Erase commands are considered, as these are the relevant operations with respect to the invention.

The memory device comprises a protection unit (2). The protection unit can be connected on the bus in order to detect any access from the master peripheral device (20). Functions of this protection unit are to decode commands to detect write or erase operation requests and to control the access validity. The protection unit provides address and data to the memory and might generate enable signals as e.g. "Locked". The protection unit may also generate and send an erase enable ("Erase_en") or write enable ("Write_en") signal, in accordance with the requested operation, to the sequencer. Obviously, the enable signals must represent an active logic state to enable a physical write or erase to the memory.

An important part of the processing in the protection unit is performed in the lock/unlock mechanism unit (3). This unit receives the signals from the bus and is capable of locking and unlocking the memory block. In this way a safe access to the memory block can be guaranteed. Details on how the lock/unlock mechanism works are provided later in this description.

The memory device comprises a sequencer (4) that handles the timing requirements for the non-volatile memory block (5). The sequencer provides control signals to the non-volatile memory block respecting a given timing related to the memory block itself. These control signals are provided only if the mentioned enable signals are active. Hence, the master peripheral device (20) does not need to care about memory timing requirements or wait for the end of the access. Once the write or erase operation has been requested, the bus is released and the master peripheral devices can perform access to other peripheral devices by using the same bus. The sequencer also provides an indication when an erase or write instruction is finished. Once the write or erase operation is terminated, the sequencer sets the flag end_of_nvop to an active logic state in order to trigger the readout port and/or the interrupt handler, for instance in order to indicate that the non-volatile operation is finished. The end_of_nvop signal is readable at a specific address in the ports area of the bus via the readout port block (6). The master peripheral device may read the readout port block at any time to check whether a write or erase operation is terminated. The master peripheral device can either wait for an interrupt (from an interrupt handler (15), which is usually external to the memory device, as also shown in FIG. 1) or can perform polling operations at this specific address to detect the end of the write or erase operation as depicted in FIG. 1. Also the protection unit (3) interprets the end of a write or erase operation end_of_nvop (see FIG. 1).

Figure 2:
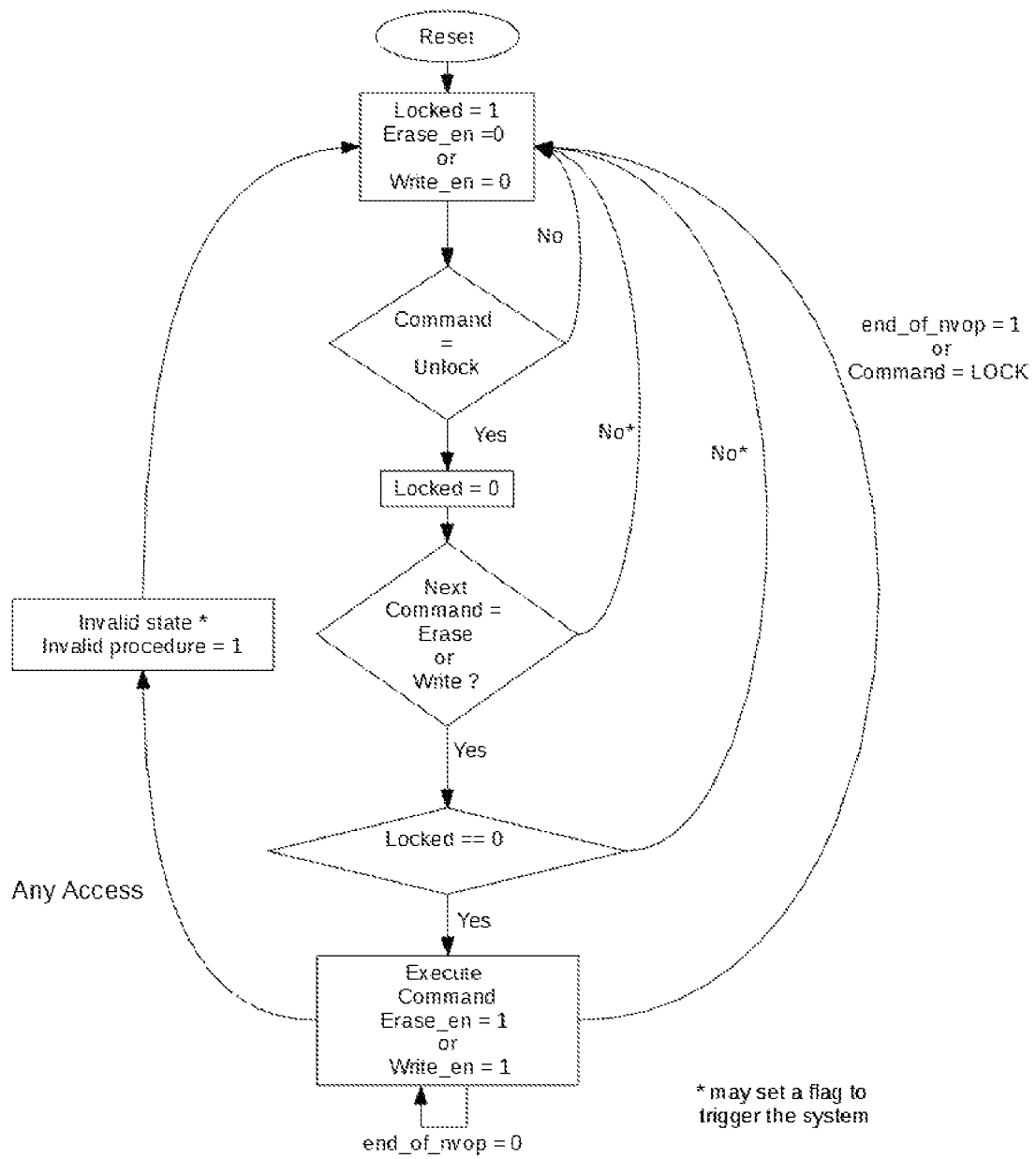
FIG. 2 illustrates a state diagram of the protection unit.

The operation of the memory device of the invention is now described in detail. After a reset, e.g. a power on reset, the protection mechanism is activated. The variable Locked is set to 1 in the state diagram of the protection unit, as shown in FIG. 2. An active signal, i.e. an active logic voltage level, is indicated as logic 1. This is, however, not necessarily so and in certain embodiments an active signal may correspond to a logic 0 setting. In other words, it is merely a matter of definition whether an active logic state is taken as a logic 1 or a logic 0. The inverse (hence, inactive) signal to the active signal is then a logic 0 or a logic 1.

Figure 3:
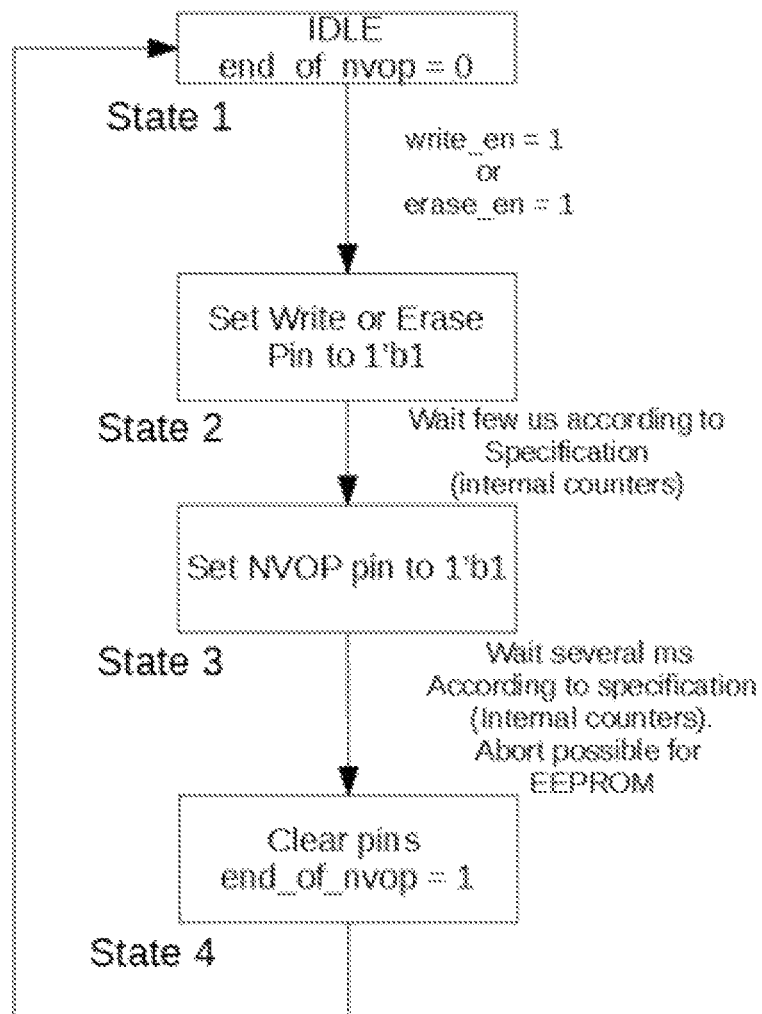
FIG. 3 illustrates the operation of the sequencer.

To perform a write or erase operation the following steps are carried out. First, the master peripheral device sends a specific command "Unlock" via the ports bus (8). Typically, this is a 16 bit data word to be written to a specific address in the port area space via the ports bus. In embodiments of the invention the data word may have a length different from 16 bits. This data word is then compared in the lock/unlock mechanism unit (3) with a 16 bits unique key. The key is of the same length as the data word and is split in two parts, UNLOCK_KEY [15:8] and UNLOCK_KEY [7:0]. In certain embodiments there may be more than two parts, while conceptually still the same approach is applied as for a split into two parts. The 16 bits unique key is not stored in the non-volatile memory block, but hard coded elsewhere in the circuit (10) (outside the memory block (5)), for instance in a ROM or in a register (not shown in FIG. 1) programmed by connecting the inputs of that register to supply and ground depending on the key code. As the non-volatile memory is intended to offer protection against unwanted write or erase operations, the keys to protect the memory should not be in this memory to be protected. They should neither be in any other non-volatile memory, as such memory might lose its content or be programmed in a wrong way, whereby the keys could be overwritten. If the received data word, e.g. of 16 bits, is in accordance with the hard coded key of the same length, this operation internally sets Locked to 0. So, the state called Locked=0 is reached in FIG. 2 and, hence, the lock protection is cleared, so that a further write or erase operation is possible. If the unlock operation fails, because the received data word of e.g. 16 bit is different from the stored key having the same length, the write or erase operation cannot be performed and the device returns to a LOCKED state. Next, the command to be performed, either an "Erase" or "Write", is sent on the bus. If the command following the unlock operation is not a write or erase command, the memory device returns to the LOCKED state. The "Erase" and "Write" commands are also data words of e.g. 16 bits to be written to a specific address in the ports area via the ports bus. Similar to the "Unlock" command, also for the "Erase" command or "Write" command the received data words are compared in the Lock/Unlock mechanism unit (3) with the unique key split in at least two parts, e.g. WRITE_KEY[15:8], WRITE_KEY[7:0] and ERASE_KEY[15:8], ERASE_KEY[7:0]. Also these hard coded keys are stored in the circuit (10). If the comparison fails, because the received data word is different from the stored hard coded key, the write or erase operation is not performed and the device goes back to a LOCKED state. If the comparison is positive, however, this operation allows reaching state "Ready to Execute Command" in FIG. 2, wherein the write enable or erase enable signal is sent to the sequencer. This is shown in state 1 in FIG. 3. The sequencer then drives the memory block input/outputs as depicted in FIG. 3 by states 2 and 3, i.e. the write or erase pin is set to a logic 1. After terminating the write or erase operation in accordance with state 4 in FIG. 3, the state machine of the protection unit goes back to the state Locked=1 (in FIG. 2, transition between last and first state). Once the Write/Erase operation has ended, the sequencer (4) sends a flag, end_of_nvop, to the protection unit (2) in order to reset its state and hence reinstall the safety mechanism of the protection unit. If another memory access is requested, while the write or erase command is being processed, the device returns to a Locked state, as also shown in FIG. 2.

As already mentioned, a write or erase operation starts inside the memory block only when one of the Write or Erase pins and the NV_OP pin are at active logic state 1. This means two pins must be in an active logic state. This is compliant with e.g. functional safety aspects of ISO 26262. This prevents any memory issue, if there is e.g. a stuck at 1 on one of this input pins. A "stuck at 1" is for instance a hard short to an active voltage level. It can also occur if one of the input pins is forced to an active voltage level by e.g. a failing register operation due to e.g. a crash in the central processing unit or an incoming electromagnetic disturbance. As a consequence, the write or erase operation physically starts only at the third stage of the sequencer state machine depicted in FIG. 3.

A Write or Erase command may arrive while the protection unit is still in a locked state. This can happen for example if an Unlock command has not been placed before or if the key comparison has failed. In that case the write or erase operation is not performed. In one embodiment of the memory device according to the invention, the protection unit then sends a message to the master peripheral device to indicate a faulty system behaviour has occurred.

Further, if a Write or Erase operation is executed and a request for e.g. a Read operation is placed, or e.g. an Erase is requested, while a previous request command is still under execution, the protection unit may also generate an error message to the master peripheral device or set an error flag, which can be read by the master peripheral device at any time. In fact, all accesses during a write or erase operation lead to an invalid state and set the memory device again to the Locked state. Further write or erase operations are therefore not performed. A flag "Invalid Procedure" (see FIG. 2) might be set to a logic 1, i.e. an active logic state, e.g. to indicate to the master peripheral device that there was a malfunction.

Also other faulty events like e.g. a failing key comparison or a missing Unlock command, can reset the state machine of the protection unit to a state Locked=1, so that no write or erase operation is possible.

Figure 4:
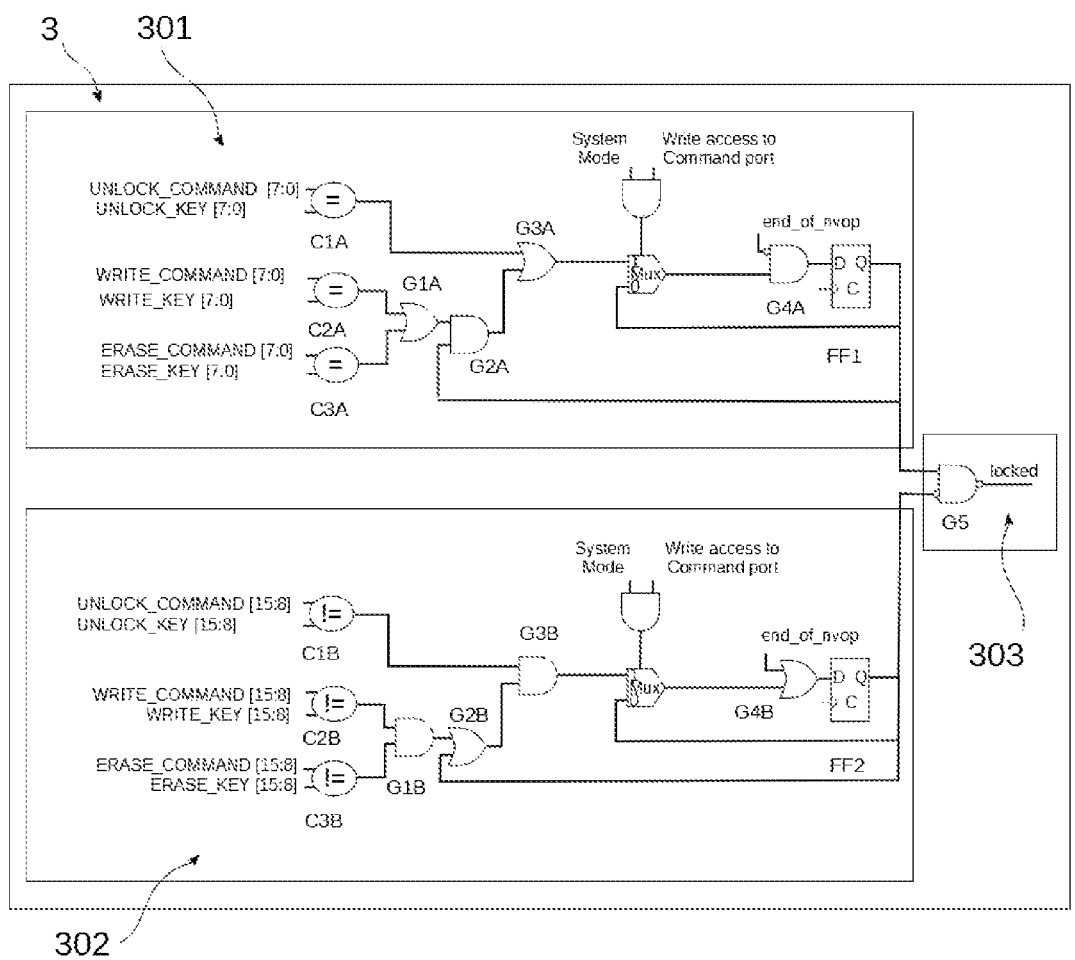
FIG. 4 illustrates an embodiment of the block comprising the lock/unlock mechanism unit in the protection unit to ensure protection of the NVM memory block.

In an advantageous embodiment the master peripheral device can set the memory device (1) in a system mode. When in this system mode, operations allowed in the memory device are limited. If the master peripheral device is not set in this system mode, the protection unit discards the write or erase operations. The lock/unlock mechanism unit stays active as depicted in FIG. 4. Hence, in this embodiment the master peripheral device must run in system mode in order to allow write or erase operations. Providing this feature offers additional safety.

The unique keys are stored in the circuit (10) in a non-changeable manner, so that they might be treated as secure against changes by, for instance, voltage changes or electromagnetic disturbances. They are neither stored in the NV program or data memory. They are hard coded by e.g. metal connections applied to e.g. registers derived during e.g. the semiconductor manufacturing process. Any other hard coded possibilities during a semiconductor manufacturing process might also be possible, e.g. poly-silicon connections or connections derived during doping leading to short circuits in transistors. The type of hard coding is for the invention not important.

An embodiment of a lock/unlock mechanism unit (3) comprised in the protection unit is illustrated in FIG. 4. The lock/unlock mechanism unit in FIG. 4 comprises logic comparators, gates and storage elements as for instance FlipFlops. The "locked" signal is built up of two states of FlipFlops FF1 and FF2 combined in a combiner logic circuit (303) formed by the Gate G5. C1A, C2A, C3A, G1A, G2A, G3A, G4A in the first subcircuit (301) are different compared to a second subcircuit (302) formed by their counterparts C1B, C2B, C3B, G1B, G2B, G3B, G4B. This enables FF1 to carry an active logic signal (in this case a logic 1), if comparing of the first part, i.e. Bytes [7:0], of the 16 bit data words with the first part (Bytes [7:0]) of the previously described keys gives a positive outcome. It further enables FF2 to carry a different active logic signal level (a logic 0 in that case), i.e. the inverse state of FF1, if the comparison of the second part (Bytes [15:8]) of the 16 bit data words with the second part (Bytes [15:8]) of the previously described keys is positive. This arrangement is very robust against failures. The enable signal (so, the comparison result of the unlock instruction and the Write or Erase instruction with their corresponding keys, hence, the inputs to gates G3A and G3B in FIG. 2 is stored as a two-bit-information. In a preferred embodiment these two bits are of an exclusive nature, with one bit being an active 1 and the other bit being an active 0.

For instance, one storage element of the lock/unlock mechanism, e.g. in the embodiment shown in FIG. 4, may be at a stuck at fault, so that it is hardly connected to a supply or ground potential. This might be due to e.g. aging of an integrated circuit or any other kind of a defect. In that case the other FlipFlop still ensures that no write or erase operation to the non-volatile memory can be carried out. It can also be seen that the device is robust against failure mechanisms, that are related to a logic 0 or to a logic 1.

An EMC disturbance can toggle one of the FlipFlops to a certain state. Similarly as described above, the other FlipFlop then keeps the locked state active, so that a write or erase operation is not possible. As the FlipFlops in the lock/unlock mechanism of the memory device of the invention work with opposite active states, the mechanism is stable against any failures independently, if the failures lead on the inputs or outputs of these FlipFlops to a permanent or temporary connection to either supply voltage or ground.

As said C1A, C2A, C3A, G1A, G2A, G3A, G4A are different compared to their counterparts C1B, C2B, C3B, G1B, G2B, G3B, G4B. This should be construed as follows. The logic comparators C1A, C2A, C3A deliver a logic 1 output if the comparison is positive. Therefore, G1A, G2A, G3A are also based on a logic 1 active signal. The logic comparators C1B, C2B, C3B deliver a logic 0 output if the comparison is positive. Therefore, G1B, G2B, G3B are based on a logic 0 active signal. Thus these logic comparators and the gates are different from their mentioned counterparts. While one signal chain for the key compare is operating on an active 1 logic level, the other signal chain is operating on the inverse active logic level, meaning that different logical elements are used. In that way also common mode failures, e.g. during EMC disturbances, which would for instance act in a different way on logic low voltage levels than on logic high voltage levels, do not cause any harm. Such failures do not lead to an unwanted write or erase operation.

As already mentioned it is advantageous in some embodiments to have the feature that the circuit (10) needs to run in system mode to allow write or erase operations in the memory device. This introduces an additional security level. Only in that mode access to the memories for write or erase operation is then possible.

Before each write or erase operation an Unlock command is placed. Each Unlock, Write, Erase command is always checked with a corresponding hard coded key stored in the circuit (10), possibly implemented as an integrated circuit, in a hard coded way. Therefore, the method is robust against faulty or unwanted accesses as they may happen e.g. during software crashes or EMC disturbances.

It is possible to reinstall the circuit at any time by writing a "Lock" command in the command port according to FIG. 2. If the NV operation was started, the sequencer in FIG. 1 aborts the access clearing the Write/Erase/NV_OP pins of the NV memory, shown in FIG. 1. Such a mode is used for emergency purposes as for instance a loss of supply.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A memory device comprising:
a non-volatile memory block to store data to be written, read or erased;
a protection unit arranged for connecting to a communication bus to detect an unlock, write or erase command and comprising a unit for locking and unlocking said memory block, said unit arranged to receive and process said unlock, write or erase command;
a sequencer arranged to receive from said protection unit, in accordance with said unlock, write or erase command, an enabling signal to enable access to said memory block,
whereby said unit for locking and unlocking comprises, for processing said unlock, write or erase command, a logic circuit arranged to output said enabling signal, said logic circuit comprising:
a first logic subcircuit arranged for comparing a first part of said command with a first part of a hard coded key, whereby a first subcircuit output signal corresponding to a first active logic signal is output if there is a match between said first part of said command and said first part of said hard coded key;
a second logic subcircuit arranged for comparing a second part of said command with a second part of said hard coded key, whereby a second subcircuit output signal corresponding to a second active logic signal inverse to said first active logic signal is output if there is a match between said second part of said command and said second part of said hard coded key;
whereby one of said first and second logic subcircuit is operable on a logic 1 active signal and the other one is operable on a logic 0 active signal; and
a combiner logic circuit arranged for combining said first and said second subcircuit output signal and for outputting said enabling signal corresponding to an active logic signal only if said first and said second subcircuit output signals correspond to said first and second active logic signal, respectively.

2. The memory device as in claim 1, wherein said logic circuit is arranged for storing said enable signal as a two-bit information.

3. The memory device as in claim 1, wherein said sequencer is arranged for setting an operational flag (NVOP) in said non-volatile memory block before actual execution of said write or erase command in said non-volatile memory block can start.

4. The memory device as in claim 3, wherein said sequencer is arranged for outputting a signal (end_of_nvop) indicating the execution of said write or erase command has ended.

5. The memory device as in claim 4, further comprising a readout port block arranged to receive, for readout, said signal indicating the execution of said write or erase command has ended.

6. The memory device as in claim 3, wherein said protection unit is arranged to return to a locked state on receipt of said signal indicating the execution of said write or erase command has ended.

7. The memory device as in claim 3, wherein said sequencer is arranged to output said signal indicating the execution of said write or erase command has ended to an external interrupt handling device.

8. The memory device as in claim 1, wherein said mechanism for locking and unlocking can be set in a system mode, in order to allow said write, unlock or erase operation to be performed.

9. The memory device as in claim 1, wherein said protection unit comprises storage means for storing said unlock, write and erase commands.

10. The memory device as in claim 9, wherein said protection unit is arranged to return to a locked state:
 if a command following an unlock command is not a write or erase command; or
 if another memory access is requested, while said write or erase command is being processed.

11. The memory device as in claim 1, comprising a ports bus arranged to receive address information, data information and commands.

12. The memory device as in claim 1, wherein said protection unit is arranged for outputting an error message reporting a faulty operation.

13. The memory device as in claim 1, arranged to receive a lock command to lock said memory block.

14. An integrated circuit comprising a memory device as in claim 1.

15. The integrated circuit as in claim 14, further comprising an interrupt handling device.

* * * * *